US012565833B2

(12) United States Patent (10) Patent No.: US 12,565,833 B2
Arukhe et al. (45) Date of Patent: Mar. 3, 2026

(54) METHODS AND SYSTEMS FOR REAL-TIME MULTIPHASE FLOW PREDICTION USING SENSOR FUSION AND PHYSICS-BASED HYBRID AI MODEL(S)

(71) Applicant: SAUDI ARABIAN OIL COMPANY, Dhahran (SA)

(72) Inventors: James Ohioma Arukhe, Dhahran (SA); Mohammed Elmetwally Gomaa, Ras Tanura (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 0 days.

(21) Appl. No.: 18/525,439

(22) Filed: Nov. 30, 2023

(65) Prior Publication Data
US 2025/0179910 A1      Jun. 5, 2025

(51) Int. Cl.
*E21B 43/12*         (2006.01)
*E21B 47/10*         (2012.01)
(Continued)

(52) U.S. Cl.
CPC ............ *E21B 47/103* (2020.05); *E21B 43/12* (2013.01); *E21B 47/10* (2013.01); *G06F 30/27* (2020.01);
(Continued)

(58) Field of Classification Search
CPC ... E21B 2200/20; E21B 2200/22; E21B 47/06
See application file for complete search history.

(56) References Cited

U.S. PATENT DOCUMENTS 10,954,766 B2 *  3/2021  Mohaghegh ............ G06F 30/28
2008/0283245 A1 *  11/2008  Tuk ......................... E21B 43/24
166/302
(Continued)

FOREIGN PATENT DOCUMENTS

WO      WO-2023066547 A1 *  4/2023

OTHER PUBLICATIONS

Alhashem, "Supervised Machine Learning in Predicting Multiphase Flow Regimes in Horizontal Pipes," Society of Petroleum Engineers, SPE-197545-MS, Nov. 11, 2019, 18 pages.
(Continued)

*Primary Examiner* — Tara Schimpf
*Assistant Examiner* — Ursula Lee Norris
(74) *Attorney, Agent, or Firm* — Osha Bergman Watanabe & Burton LLP

(57) ABSTRACT
A method for determining multiphase flow rates from a well in real-time, the method includes obtaining temperature and pressure data of flow of a multiphase fluid that includes a first phase at one or more locations in a wellbore conveying the flow. The flow is controlled, at least in part, by a set of well operation parameters. The method further includes determining, with an artificial intelligence (AI) model, a first predicted flow rate of the first phase at a first location given an input that includes the temperature and pressure data. The method further includes determining, with an optimizer applied to the AI model, an optimal set of well operation parameters based on, at least, the first predicted flow rate. The method further includes adjusting, automatically, the set of well operation parameters to the optimal set of well operation parameters.

8 Claims, 11 Drawing Sheets

(51) Int. Cl.
    *E21B 47/103*       (2012.01)
    *G06F 30/27*       (2020.01)

(52) U.S. Cl.
    CPC ....... *E21B 2200/20* (2020.05); *E21B 2200/22*
                             (2020.05)

(56)             References Cited

U.S. PATENT DOCUMENTS

| | | | | |
|---|---|---|---|---|
| 2013/0246032 A1* | 9/2013 | El-Bakry | ................. | G06F 30/20 |
| | | | | 703/10 |
| 2023/0213323 A1* | 7/2023 | Assous | ................ | G01N 17/006 |
| | | | | 702/6 |
| 2023/0265753 A1* | 8/2023 | Almarhoon | ............. | E21B 43/00 |
| | | | | 703/10 |
| 2024/0044691 A1* | 2/2024 | Shukla | .................... | G01F 25/10 |
| 2024/0118118 A1* | 4/2024 | Drew | ...................... | G01F 15/06 |

OTHER PUBLICATIONS

"Evaluation and Proper Selection of Multiphase Flow Correlations," 2016, Retrieved from URL <https://www.researchgate.net/publication/341992519_EVALUATION_AND_PROPER_SELECTION_OF_MULTIPHASE_FLOW_CORRELATIONS>, 304 pages.

"Multiphase phase flow correlations" Accessed Nov. 2023, Retrieved from <https://production-technology.org/multiphase-flow-correlations/>, 9 pages.

Omar Ghattas and Karen Willcox, "Learning physics-based models from data: perspectives from inverse problems and model reduction," Published online by Cambridge University Press: Aug. 4, 2021, Retrieved from URL <https://www.cambridge.org/core/journals/acta-numerica/article/learning-physicsbased-models-from-data-perspectives-from-inverse-problems-and-model-reduction/C072A4B417F8C3873ED75C1D63BBB31D>, 110 pages.

Tournier et al., "Production Monitoring and Optimization on a Mature Field," SPE International—SPE-137969, Nov. 1, 2010, 10 pages.

T. Bikmukhametov, "Machine Learning and First Principles Modeling Applied to Multiphase Flow Estimation—with a Focus on the oil and gas industry," Doctoral Theses at NTNU, Dec. 2020, Retrieved from URL <https://ntnuopen.ntnu.no/ntnu-xmlui/bitstream/handle/11250/2724598/Timur%20Bikmukhametov.pdf?sequence=1> (125 pages).

* cited by examiner

702

410

Trained AI Model $p = f$ (Inputs)

Optimization Wrapper
arg max P
$S_1$

Subject to: Device Constraints

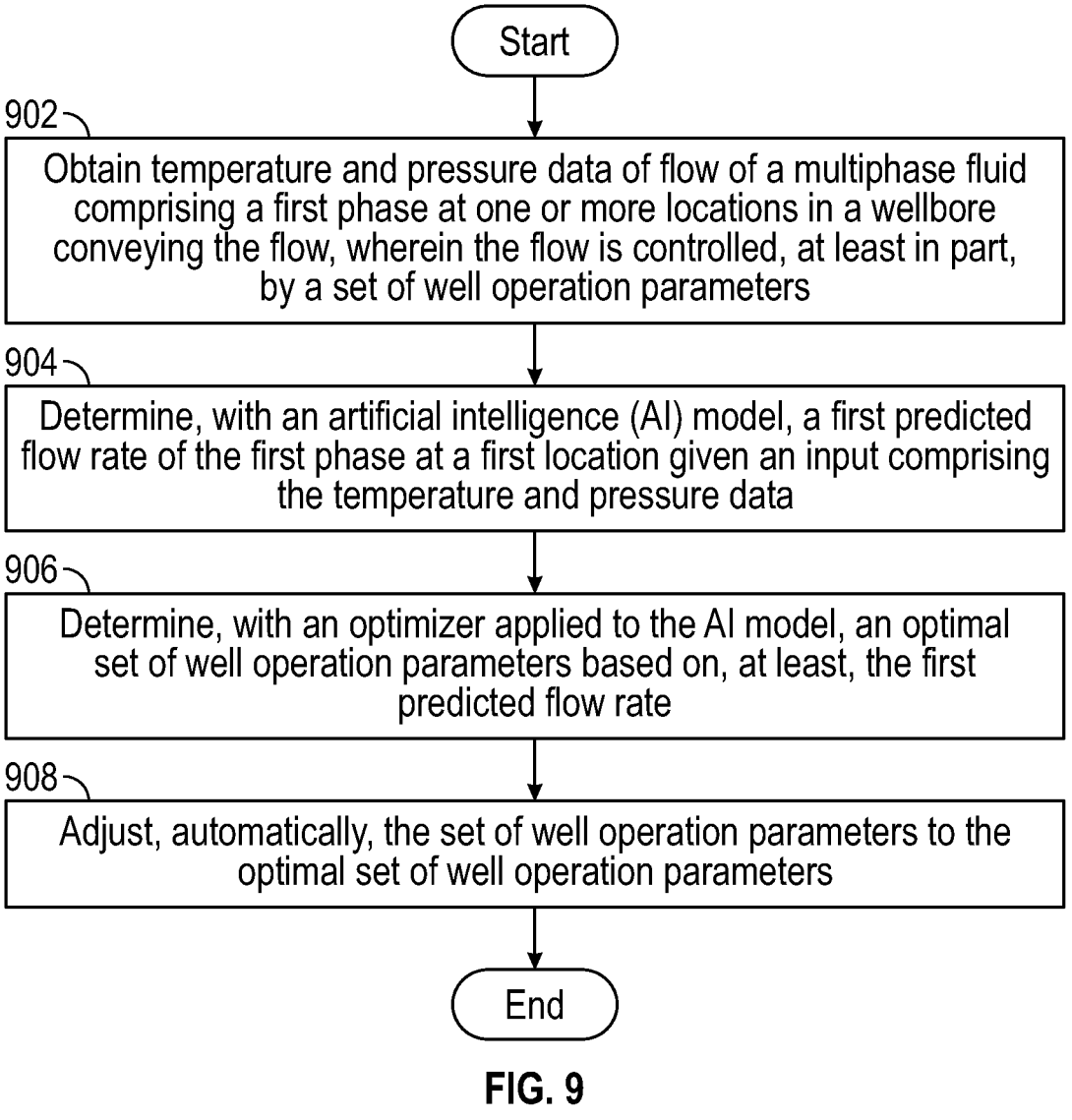

Start

902 —

Obtain temperature and pressure data of flow of a multiphase fluid comprising a first phase at one or more locations in a wellbore conveying the flow, wherein the flow is controlled, at least in part, by a set of well operation parameters

904 —

Determine, with an artificial intelligence (AI) model, a first predicted flow rate of the first phase at a first location given an input comprising the temperature and pressure data

906 —

Determine, with an optimizer applied to the AI model, an optimal set of well operation parameters based on, at least, the first predicted flow rate

908 —

Adjust, automatically, the set of well operation parameters to the optimal set of well operation parameters End

FIG. 9

METHODS AND SYSTEMS FOR REAL-TIME MULTIPHASE FLOW PREDICTION USING SENSOR FUSION AND PHYSICS-BASED HYBRID AI MODEL(S)

BACKGROUND

As oil, gas, and water are produced from a well, they typically flow as a non-homogeneous mixture of phases through a pipeline from the wellhead to a separator. To efficiently operate a well, the flow rates of oil, gas, and water should be determined. Conventionally, a device such as a multiphase flow meter can be installed on a pipeline to measure the constituent flow rates of a passing multiphase fluid. Generally, these devices are expensive and require maintenance to provide accurate flow rate measurements. Accordingly, there exists a need to accurately determine the phase flow rates of a multiphase fluid using one or more already existing sensors associated with the well.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Embodiments disclosed herein generally relate to a method for determining multiphase flow rates from a well in real-time, the method includes obtaining temperature and pressure data of flow of a multiphase fluid that includes a first phase at one or more locations in a wellbore conveying the flow. The flow is controlled, at least in part, by a set of well operation parameters. The method further includes determining, with an artificial intelligence (AI) model, a first predicted flow rate of the first phase at a first location given an input that includes the temperature and pressure data. The method further includes determining, with an optimizer applied to the AI model, an optimal set of well operation parameters based on, at least, the first predicted flow rate. The method further includes adjusting, automatically, the set of well operation parameters to the optimal set of well operation parameters.

Embodiments disclosed herein generally relate to a computer-implemented method of training an artificial intelligence (AI) model, the method includes obtaining a multiphase wellbore simulator based on physics that simulates a flow of a multiphase fluid including a first phase throughout a wellbore given a set of simulation parameters. The set of simulation parameters includes a set of wellbore geometry parameters that define a geometry of the wellbore, a set of fluid property parameters, a set of well completion parameters, a set of well operation parameters, a set of reservoir properties, a first temperature at a first location in the wellbore, and a first pressure at a second location in the wellbore. The method further includes obtaining a third location, the third location indicating a location of the wellbore where a determination of a first flow rate of the first phase is desired. The method further includes determining a plurality of sets of simulation parameters. The method further includes determining a simulated first flow rate of the first phase at the third location for each set of simulation parameters in the plurality of sets of simulation parameters using the multiphase wellbore simulator. The method further includes creating a training set that includes a subset of the plurality of sets of simulation parameters each associated with the simulated first flow rate as previously determined by the multiphase wellbore simulator. The method further includes training the AI model with the training set to determine a first predicted flow rate at the third location given an input set of simulation parameters.

Embodiments disclosed herein generally relate to a system including a well with a wellbore conveying a flow of a multiphase fluid. The flow is controlled, at least in part, by a set of well operation parameters. The system further includes a pressure sensor and a temperature sensor disposed in the wellbore and a computer including one or more computer processors. The computer is configured to obtain temperature and pressure data of the flow of the multiphase fluid from the pressure sensor and the temperature sensor. The computer is further configured to determine, with an artificial intelligence (AI) model, a first predicted flow rate of a first phase of the multiphase fluid at a first location given an input that includes the temperature and pressure data. The computer is further configured to determine, with an optimizer applied to the AI model, an optimal set of well operation parameters based on, at least, the first predicted flow rate. The computer is further configured to adjust, automatically, the set of well operation parameters to the optimal set of well operation parameters.

The present invention relates to methods and systems for real-time prediction of multiphase fluid flow in a subsurface well environment using a hybrid approach that integrates sensor data with physics-based simulations and artificial intelligence (AI) models. The method includes obtaining temperature and pressure data of a multiphase fluid flow from one or more locations in a wellbore. An AI model, which may be a neural network, uses this data to predict flow rates of the fluid phases. An optimizer applies algorithms to the AI model to determine an optimal set of well operation parameters, such as choke settings, based on the predicted flow rates. The system then automatically adjusts the well operation parameters to optimize the flow. The AI model can be trained using a multiphase wellbore simulator that simulates flow based on a set of physical equations and simulation parameters. Embodiments disclosed herein enable improved oil and gas production by providing accurate flow rate measurements and proactive maintenance scheduling, even in the event of multiphase flow meter malfunctions.

Other aspects and advantages of the claimed subject matter will be apparent from the following description and the appended claims.

BRIEF DESCRIPTION OF DRAWINGS

FIG. 9 depicts a flowchart, in accordance with one or more embodiments.

DETAILED DESCRIPTION

Figure 1:
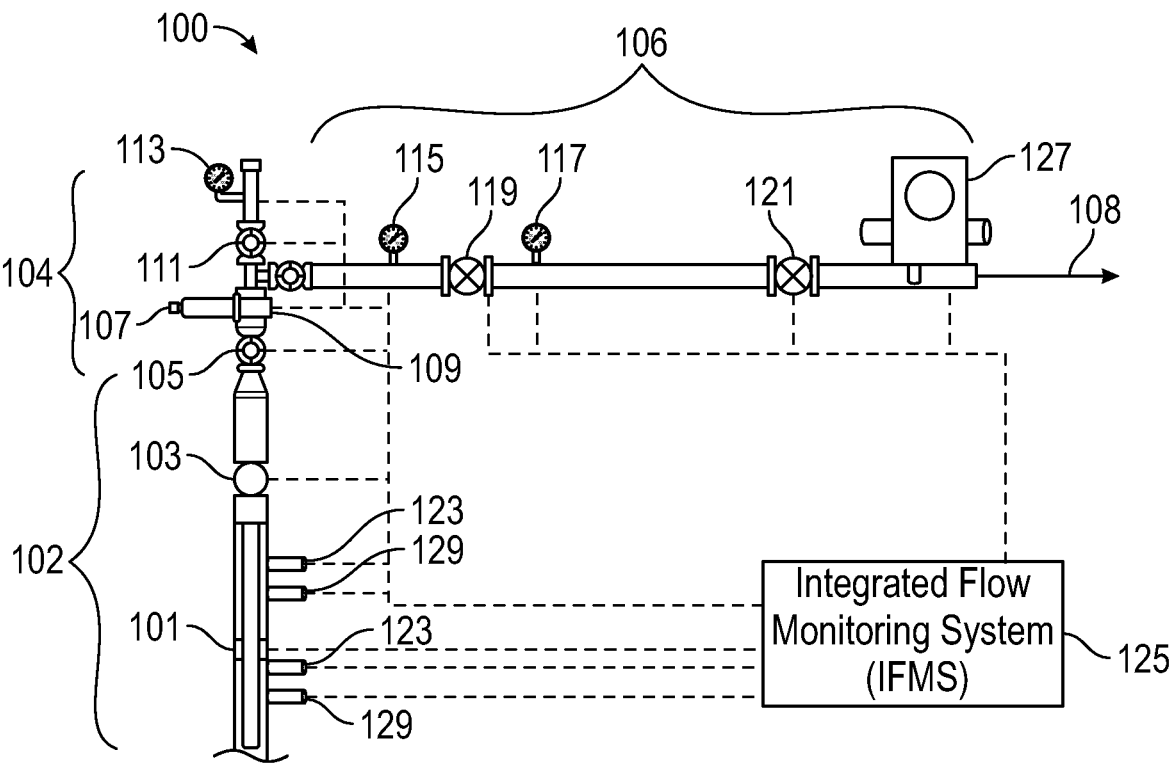
FIG. 1 depicts a pipeline, in accordance with one or more embodiments.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

It is to be understood that the singular forms "a," "an," and "the" include plural referents unless the context clearly dictates otherwise. For example, a "simulated flow rate" may include any number of "simulated flow rates" without limitation.

Terms such as "approximately," "substantially," etc., mean that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

It is to be understood that one or more of the steps shown in the flowcharts may be omitted, repeated, and/or performed in a different order than the order shown. Accordingly, the scope disclosed herein should not be considered limited to the specific arrangement of steps shown in the flowcharts.

Although multiple dependent claims are not introduced, it would be apparent to one of ordinary skill that the subject matter of the dependent claims of one or more embodiments may be combined with other dependent claims.

In the following description of FIGS. 1-11, any component described with regard to a figure, in various embodiments disclosed herein, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments disclosed herein, any description of the components of a figure is to be interpreted as an optional embodiment which may be implemented in addition to, in conjunction with, or in place of the embodiments described with regard to a corresponding like-named component in any other figure.

Embodiments disclosed herein generally relate to methods and systems for determining multiphase flow rates from a well in real-time using temperature and pressure data of the flow at one or more locations of a conduit (e.g., a pipe) conveying the multiphase flow. As will be described, these methods and systems use an artificial intelligence (AI) model to determine the individual flow rates of one or more phases of a multiphase fluid. The AI model is trained using an associated physics-based simulator such that the AI model, once trained, has learned (or is at least constrained) by the physics governing the flow of the multiphase fluid over a variety of situations (e.g., reservoir properties and conditions). Further, in one or more embodiments, the AI model is used to determine an optimal set of well operation parameters, where the well operation parameters directly affect the flow of the multiphase fluid, to optimize the operation of the well. In one or more embodiments, the state of one or more well operation parameter in the set of well operation parameters is controlled, automatically, by the methods and systems of this disclosure based on, at least, the individual phase flow rates determined using the AI model.

AI, broadly defined, is the extraction of patterns and insights from data. The phrases "artificial intelligence", "machine learning", "deep learning", and "pattern recognition" are often convoluted, interchanged, and used synonymously throughout the literature. This ambiguity arises because the field of "extracting patterns and insights from data" was developed simultaneously and disjointedly among a number of classical arts like mathematics, statistics, and computer science. For consistency, the term artificial intelligence (AI), will be adopted herein, however, one skilled in the art will recognize that the concepts and methods detailed hereafter are not limited by this choice of nomenclature. More information regarding the AI model is given later in the instant disclosure.

AI model types may include, but are not limited to, neural networks, random forests, generalized linear models, and Bayesian regression. AI model types are usually associated with additional "hyperparameters" which further describe the model. For example, hyperparameters providing further detail about a neural network may include, but are not limited to, the number of layers in the neural network, choice of activation functions, inclusion of batch normalization layers, and regularization strength. The selection of hyperparameters surrounding a model is referred to as selecting the model "architecture." Generally, and as will be described later in the instant disclosure, multiple model types and associated hyperparameters are tested and the model type and hyperparameters that yield the greatest predictive performance on a hold-out set of data is selected.

In accordance with one or more embodiments, FIG. 1 depicts a simplified portion of a pipeline (100) of a multilateral well in an oil and gas field. Herein, an oil and gas field is broadly defined to consist of wells which produce at least some oil and/or gas. Hydrocarbon wells typically produce oil, gas, and water in combination. The relative amounts of oil, gas, and water may differ between wells and vary over any one well's lifetime.

For clarity, the pipeline (100) is divided into three sections; namely, a subsurface (102) section, a tree (104) section, and a flowline (106) section. It is emphasized that pipelines (100) and other components of wells and, more generally, oil and gas fields may be configured in a variety of ways. As such, one with ordinary skill in the art will appreciate that the simplified view of FIG. 1 does not impose a limitation on the scope of the present disclosure.

As part of the subsurface (102) section, FIG. 1 shows an inflow control valve (ICV) (101). An ICV (101) is an active component usually installed during well completion. The ICV (101) may partially or completely choke flow into a well. Generally, multiple ICVs (101) are installed along the reservoir section of a wellbore. Each ICV (101) is separated from the next by a packer. Each ICV (101) can be adjusted and controlled to alter flow within the well and, as the reservoir depletes, prevent unwanted fluids from entering the wellbore. Also shown as part of the subsurface (102) section of the pipeline (100) is a subsurface safety valve (SSSV) (103). The SSSV (103) is designed to close and completely stop flow in the event of an emergency. Generally, an SSSV (103) is designed to close on failure. That is, the SSSV (103) requires a signal to stay open and loss of the signal results in the closing of the valve. The subsurface (102) section may also be outfitted with one or more temperature (123) and pressure (129) sensors to monitor, in real-time, subsurface multiphase fluid flows.

Turning to the tree (104) section of FIG. 1 is a master valve (MV) (105), a surface safety valve (SSV) (107), and a wing valve (WV) (109). The MV (105) controls all flow from the wellbore. For safety considerations, a MV (105) is usually considered so important that two master valves (MVs) (second not shown) are used wherein one acts as a backup. Like unto the SSSV (103), the SSV (107) is a valve installed on the upper portions of the wellbore to provide emergency closure and stoppage of flow. Again, SSVs (107) are designed to close on failure. One or more WVs (109) may be located on the side of the tree (104) section, or on temporary surface flow equipment (not shown). WVs (109) may be used to control and isolate production fluids and/or be used for treatment or well-control purposes. Also shown in FIG. 1 is a control valve (CV) (111) and a pressure gauge (113). The CV (111) is a valve that controls a process variable, such as pressure, flow, or temperature, by modulating its opening. The pressure gauge (113) monitors the fluid pressure at the tree (104) section.

Turning to the flowline (106) section, the flowline (106) transports (108) the fluid from the well to a storage or processing facility (not shown). A choke valve (119) is disposed along the flowline (106). The choke valve (119) is used to control flow rate and reduce pressure for processing the extracted fluid at a downstream processing facility. In particular, effective use of the choke valve (119) prevents damage to downstream equipment and promotes longer periods of production without shut-down or interruptions. The choke valve (119) is bordered by an upstream pressure transducer (115) and a downstream pressure transducer (117) which monitor the pressure of the fluid entering and exiting the choke valve (119), respectively. The flowline (106) shown in FIG. 1 has a block and bleed valve system (121) which acts to isolate or block the flow of fluid such that it does not reach other downstream components.

The various valves, pressure gauges and transducers, and sensors depicted in FIG. 1 may be considered field devices of an oil and gas field. As shown, these field devices may be disposed both above and below the surface of the Earth. These field devices are used to monitor and control components and sub-processes of an oil and gas field. It is emphasized that the oil and gas field devices depicted in FIG. 1 are non-exhaustive. Additional devices, such as electrical submersible pumps (ESPs) (not shown) may be present in an oil and gas field with their associated sensing and control capabilities. For example, an ESP may monitor the temperature and pressure of a fluid local to the ESP and may be controlled through adjustments to ESP speed or frequency.

The field devices may be distributed, local to the sub-processes and associated components, global, connected, etc. The field devices may be of various control types, such as a programmable logic controller (PLC) or a remote terminal unit (RTU). For example, a programmable logic controller (PLC) may control valve states, pipe pressures, warning alarms, and/or pressure releases throughout the oil and gas field. In particular, a programmable logic controller (PLC) may be a ruggedized computer system with functionality to withstand vibrations, extreme temperatures, wet conditions, and/or dusty conditions, for example, around a pipeline (100). With respect to an RTU, an RTU may include hardware and/or software, such as a microprocessor, that connects sensors and/or actuators using network connections to perform various processes in the automation system. As such, a distributed control system may include various autonomous controllers (such as remote terminal units) positioned at different locations throughout the oil and gas field to manage operations and monitor sub-processes. Likewise, a distributed control system may include no single centralized computer for managing control loops and other operations.

In accordance with one or more embodiments, FIG. 1 depicts an integrated flow monitoring system (IFMS) (125). The IFMS includes functionality for field device monitoring and data collection. In one or more embodiments, the IFMS (125) further includes functionality for issuing field device commands, functionality to output and visualize multiphase flow rate measurements to a control room or operations center, analyze MPFMs for malfunctions, recommend preventative maintenance activities, provide alerts and/or alarms, intelligently predict multiphase flow rates from field device data (e.g., an AI predicted flow rate (608)), and continuously provide accurate multiphase flow rate measurements regardless of the state of any MPFM. To emphasize that the IFMS (125) can monitor and, in some embodiments, control the various field devices of a well and/or an oil and gas field, dashed lines connecting various field devices to the IFMS (125) are shown in FIG. 1.

A multiphase fluid is composed of one or more phases including, but not limited to, oil, water, and gas. For conciseness, the term multiphase is adopted throughout this disclosure, even when referring to a single-phase fluid. However, one skilled in the art will recognize that the concepts and methods detailed hereafter are not limited by this choice of nomenclature.

Figure 2:
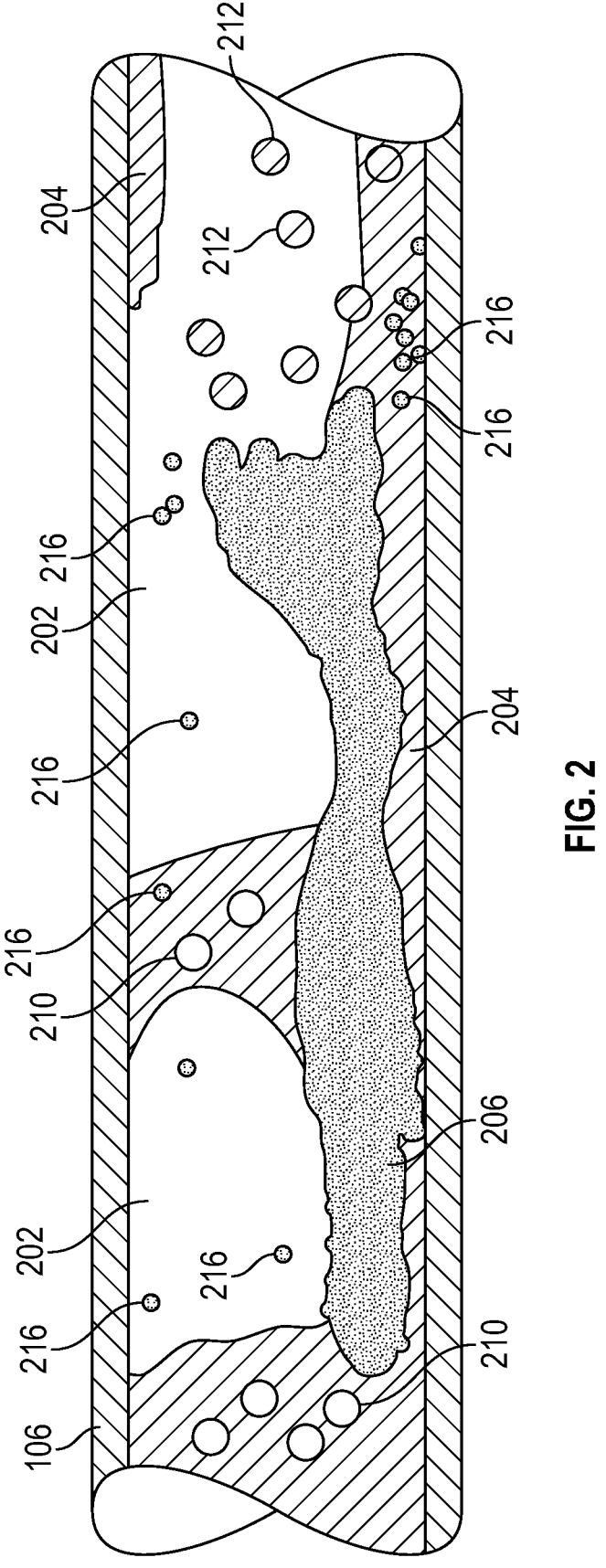
FIG. 2 depicts a multiphase fluid flowing in a pipe, in accordance with one or more embodiments.

FIG. 2 depicts a simplified view of a cross-section of a flowline (106) carrying a multiphase fluid. As seen, the multiphase fluid may have multiple constituents such as gas (202), water (204), and oil (206). The various constituents of the multiphase fluid may be distributed within the flowline (106) in a myriad of ways. As a non-limiting example, gas (202) may be enclosed by liquids (water or oil) forming bubbles (210). Or, in contrast, liquid droplets, such as oil droplets (216) and water droplets (212), may be dispersed in the gas (202) to form a mist. In general, the state of the multiphase fluid may be described using broad classifications. That is, the multiphase fluid may be categorized as "bubbly," "annular," "churn," "mist," "stratified," or other designations (flow classes) based on the distribution of the constituents and their relative quantities. The state of the multiphase fluid may be transient such that any assignment of flow class may change with time.

Oil and gas field devices, like those shown in FIG. 1 (and others not shown), monitor and govern the behavior of the components and sub-processes of the well and/or the oil and gas field. Therefore, the productivity of the well and/or the oil and gas field is directly affected, and may be altered by, at least some, of the field devices. Generally, complex interactions between oil and gas field components and sub-processes exist such that configuring field devices for optimal production is a difficult and laborious task. Further, the state and behavior of oil and gas fields is transient over the lifetime of the constituent wells, requiring continual changes to the field devices to enhance production.

To inform and optimize the settings of the field devices of a pipeline (100) to maximize hydrocarbon production, it is beneficial, if not critical, to determine the instantaneous state of the multiphase flow. To this end, the pipeline (100) depicted in FIG. 1 is outfitted with a multiphase flow meter (MPFM) (127). A MPFM (127) is a device installed on the flowline (106) to measure the rate at which each phase—oil, gas, water—is flowing. That is, the MPFM (127) may detect the instantaneous amount of gas, oil, and water flowing in the pipeline (100). As such, the MPFM (127) indicates additional quantities such as percent water cut (% WC) and the gas-to-oil ratio (GOR). However, accurate flow rate data may not be available from a MPFM, or other physical flow rate sensing device and/or system; either because a MPFM is not available (e.g., cost constraints, form factor limitations, etc.) or because a MPFM is faulty. As such, embodiments disclosed herein develop and make use of an artificial intelligence (AI) model to determine multiphase flow rates. Specifically, the AI model is configured to predict multiphase flow rates from a well in real-time using temperature and pressure data of the flow at one or more locations in the wellbore. In an example use of the present invention, the AI model can be used when multiphase flow rates cannot be accurately measured (e.g., faulty MFPM). One with ordinary skill in the art will appreciate that many more examples exist, as will be described later in the instant disclosure, and may be used without limiting the scope of the present disclosure.

In another example use of the present invention, the AI model can be used to predict the flow rate of oil, gas, and water produced by a well over a variety of proposed well parameters and/or adjustments such that various well operating conditions can be effectively virtually tested before implementation. The AI model is trained using an associated physics-based simulator such that the AI model, once trained, has learned (or is at least constrained) by the physics governing the flow of the multiphase fluid over a variety of situations (e.g., reservoir properties and conditions). In another example use of the present invention, the AI model is trained using simulated training data composed of multiphase flow rates that are simulated using a physics-based simulator given a set of simulation parameters. One with ordinary skill in the art will appreciate that many more examples exist, as will be described later in the instant disclosure, and may be used without limiting the scope of the present disclosure.

Figure 3:
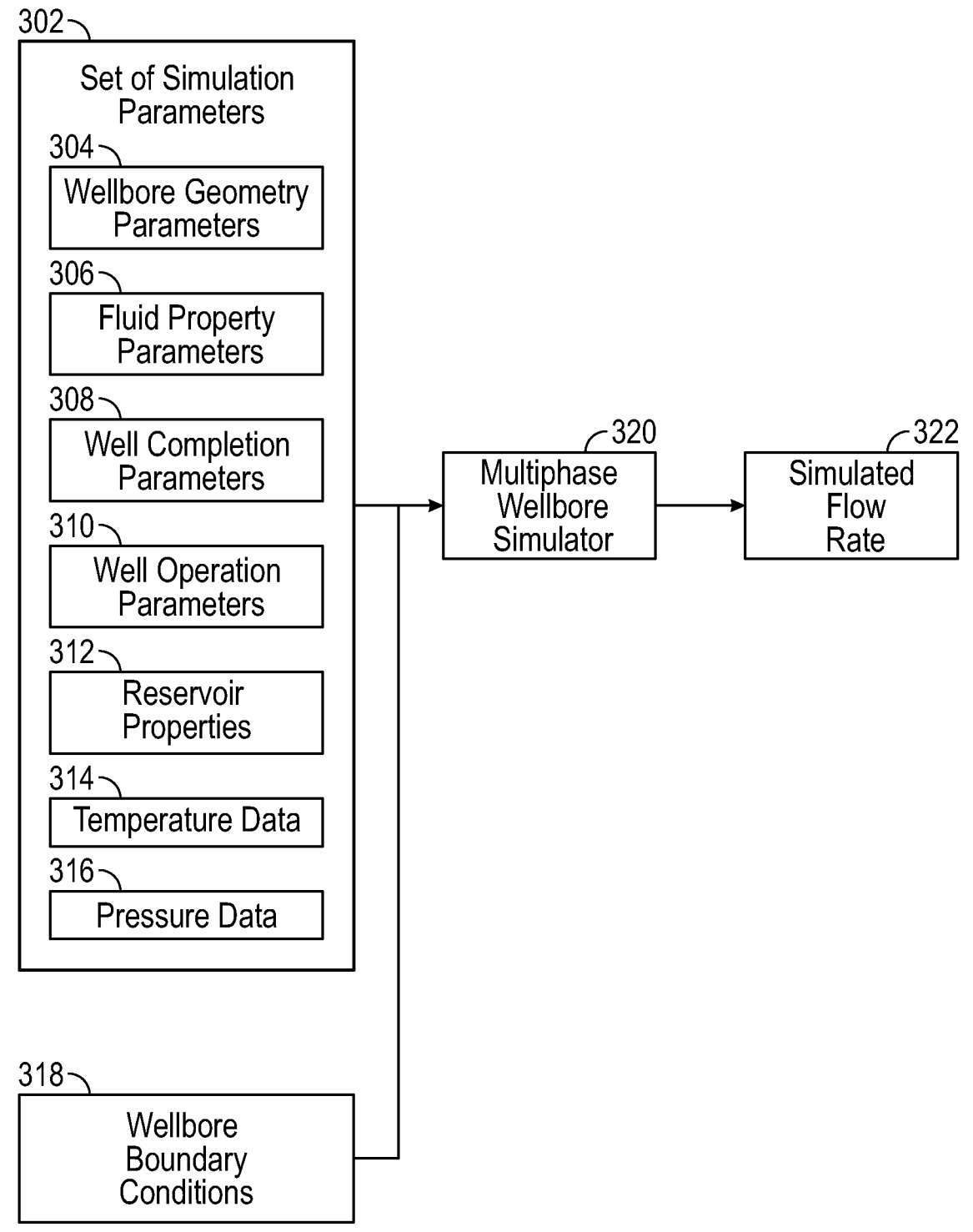
FIG. 3 depicts a system, in accordance with one or more embodiments.

In accordance with one or more embodiments, FIG. 3 depicts a model outlining a process to generate training data for an AI model using a simulator configured to simulate a flow of a multiphase fluid through a pipeline (e.g., the pipeline (100) of FIG. 1). To start, a set of simulation parameters (302) and wellbore boundary conditions (318) are received by a multiphase wellbore simulator (320). The wellbore boundary conditions (318) may dictate, for example, the inlet and/or outlet conditions of the simulated flow. Examples of the set of simulation parameters (302) are shown. In accordance with one or more embodiments, the set of simulator parameters (302) may include wellbore geometry parameters (304), fluid property parameters (306), well completion parameters (308), well operation parameters (310), reservoir properties (312), temperature data (314) and pressure data (316). For example, wellbore geometry parameters (304) may include wellbore diameter, well depth and well inclination. Fluid property parameters (306) may include viscosity and density. Well completion parameters (308) may include the number and location of packers. Well operation parameters (310) may include injection rates and choke settings. Reservoir properties (312) may include permeability and porosity. Subsurface measurements, such as temperature data (314) and pressure data (316) may be obtained at one or more locations from well subsurface systems.

In one or more embodiments, temperature and pressure (which may be represented as temperature data (314) and pressure data (316)) at one or more subsurface locations are used as wellbore boundary conditions (318). That is, the multiphase wellbore simulator (320) can be used to simulate the flow of a multiphase fluid where the simulated flow will adhere to one or more prescribed temperatures and pressures at one or more given locations. For conciseness, not all simulation parameters (302) are enumerated in FIG. 3. However, one with ordinary skill in the art will recognize that many alterations to the simulation parameters (302) of FIG. 3 can be made without departing from the scope of this disclosure and that these alterations may necessitate fewer or additional simulation parameters (302).

In accordance with one or more embodiments, the multiphase wellbore simulator (320) of FIG. 3 outputs a simulated flow rate (322). To simulate the flow rate, the multiphase wellbore simulator (320) requires governing equations that capture the thermodynamics and fluid dynamics of the multiphase flow. These equations may include, for example, the mass balance, energy balance, and momentum balance equations. The multiphase wellbore simulator (320) may employ numerical methods such as a finite difference or finite volume method to solve the governing equations. This would involve, for example, discretizing the well into small cells and solving the governing equations at each cell using the temperature data (314) and pressure data (316) at one or more locations on the subsurface (102) section as inputs, the multiphase wellbore simulator (320) configured by the set of simulation parameters (302) and wellbore boundary conditions (318). A plurality of sets of simulation parameters (302) and associated simulated flow rates (322) may be used to generate a synthetic dataset to train an AI model, as detailed below.

Figure 4:
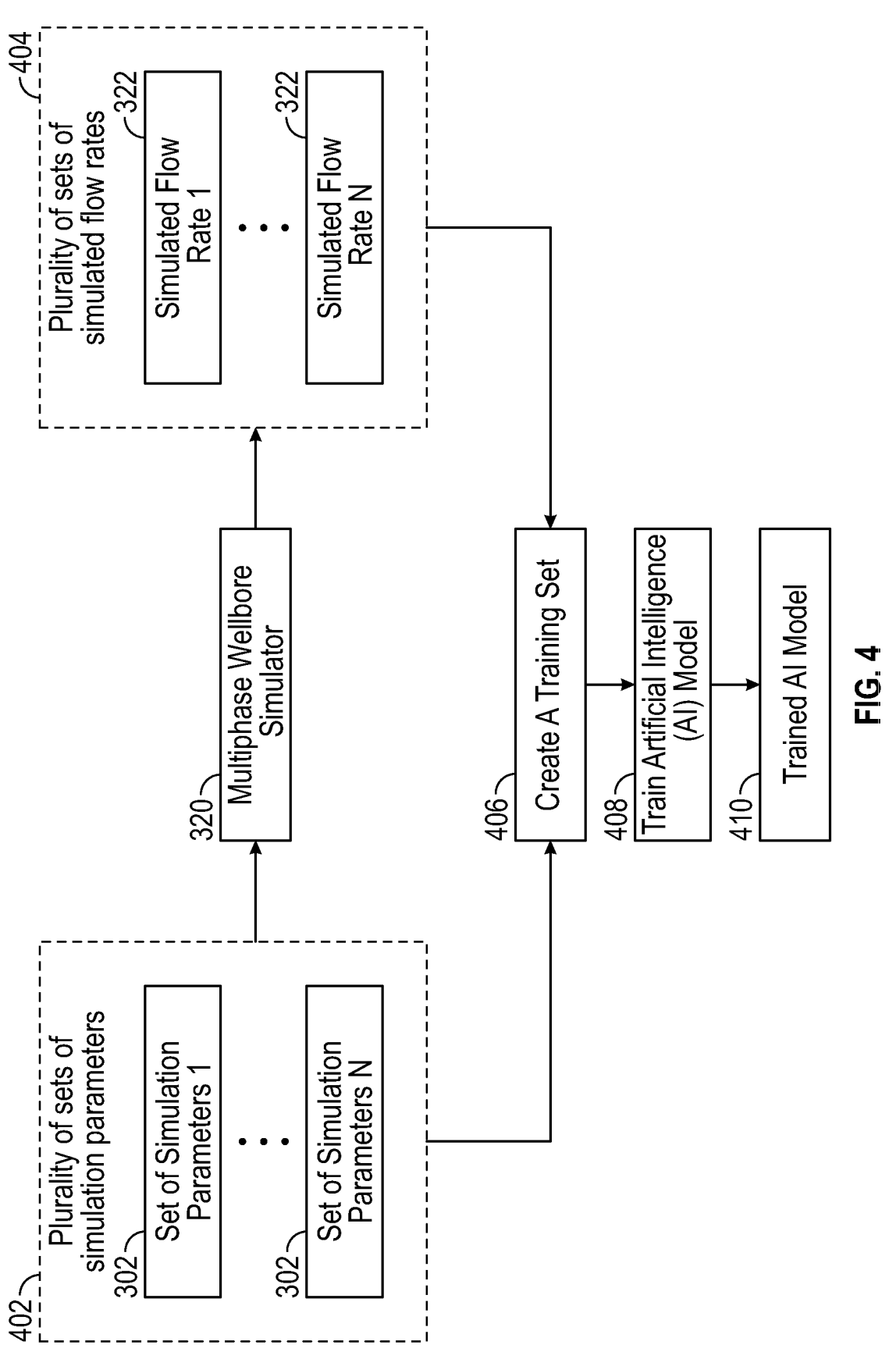
FIG. 4 depicts a synthetic data generation process, in accordance with one or more embodiments.

In accordance with one or more embodiments, FIG. 4 depicts a flowchart outlining the synthetic dataset generation process. As seen in FIG. 4, a plurality of sets of simulation parameters (402) are received as inputs by the multiphase wellbore simulator (320). As previously stated, the set of simulation parameters (302) may include wellbore geometry parameters (304), fluid property parameters (306), well completion parameters (308), well operation parameters (310), reservoir properties (312), temperature data (314) and pressure data (316) obtained at one or more locations on the subsurface (102) section. It is noted that the set of simulation parameters (302) may include categorical variables too. For example, well completion parameters (308) may be of a completion type, such as multistage fracturing, perforated packers, etc.

In accordance with one or more embodiments, the multiphase wellbore simulator (320) outputs a plurality of sets of simulated flow rates (404), each associated with a set of simulation parameters. The synthetic dataset generation process creates a training set comprising a subset of the plurality of sets of simulation parameters (402) and the plurality of sets of simulated flow rates (404). The training set is used to train the AI model (408) as described in greater detail below. In Block 410 of FIG. 4, once the AI model has been trained, it may be used "in production", which means the trained AI model is used to process a received input without having a paired target for comparison.

In one or more embodiments, the set of simulation parameters (302) are selected by discretizing the multi-dimensional parameter space. Discretization includes deciding which points, and how many points, should be sampled across the combinations of all possible parameters. An ideal discretization would cover the entire parameter space, thus providing the complete response of a model. However, given time and resource constraints, numerical simulators (e.g., the multiphase wellbore simulator (320)) need an efficient way to fill the parameter space while using fewer sample points.

In one or more embodiments, the set of simulation parameters (302) are prescribed according to a random design. In these embodiments, samples are drawn from a random uniform distribution bounded by the parameter space. In a random design, it is unlikely that a large proportion of these samples will overlap, as the samples are randomly selected across all dimensions of the multi-dimensional parameter space. However, because there is no control over how the samples are selected, there is no guarantee against a design in which samples end up clustered together.

Space-filling designs are sampling methods designed to efficiently partition the parameter space of a computer simulation. The primary goal of these designs is to ensure that the sample points are evenly spread across the entire parameter space, rather than being clustered in specific regions. In one or more embodiments, the set of simulation parameters (302) are prescribed according to a space-filling design. Examples of space-filling designs may include, but are not limited to: Latin hypercube sampling, maximin and uniform designs. Latin hypercube sampling, for example, places each sampling point in a unique position in all dimensions. Maximin designs places the points in the parameter region as far apart from each other as possible. Uniform designs seek sampling points that are uniformly scattered across the parameter space.

In one or more embodiments, sets of simulation parameters are generated according to an intelligent design or active learning method. While a space-filling design may seek to efficiently partition or sample a space of possible simulation parameters, an intelligent design or active learning method, in general, seeks to generate sets of simulation parameters such that these sets, when used to train an artificial intelligence (AI) model, result in a high performing model relative to other AI models trained using other sets of simulation parameters. Intelligent design or active learning methods may include a genetic algorithm, Bayesian search, or a Gaussian process. For example, while a full description of a Gaussian process exceeds the scope of this disclosure, it may simply be said that a Gaussian process-based sampling may be used to intelligently and iteratively to select the points in a parameter space that are the most likely to yield an optimal outcome (e.g., accurately represent an unknown objective function) based on the information available. By modeling the unknown objective function as Gaussian process, the uncertainty associated with the function can be estimated at each point in the parameter space. This information is then used to guide the selection of the next sampling point. This iteration continues until a stopping criterion is met. The output of a Gaussian process for a given input will follow a normal distribution with a mean value and a variance. Because the outputs of a Gaussian process follow a normal distribution, the Gaussian process naturally lends itself to uncertainty quantification. As such, the domain of inputs may be intelligently searched to discover the optimal outputs within the bounds of uncertainty. Further, the intelligent design or active learning method may be used to identify regions of the parameter space spanned by possible sets of simulation parameters that are non-physical (e.g., a set of simulation parameters that causes the multiphase wellbore simulator to fail). For example, the parameter space may be bounded by a set of constraints and the set of constraints is learned and adaptively updated while determining the plurality of sets of simulation parameters. That is, a set of simulation parameters may be generated based on the simulated result of one or more prior sets of simulation parameters.

Figure 5:
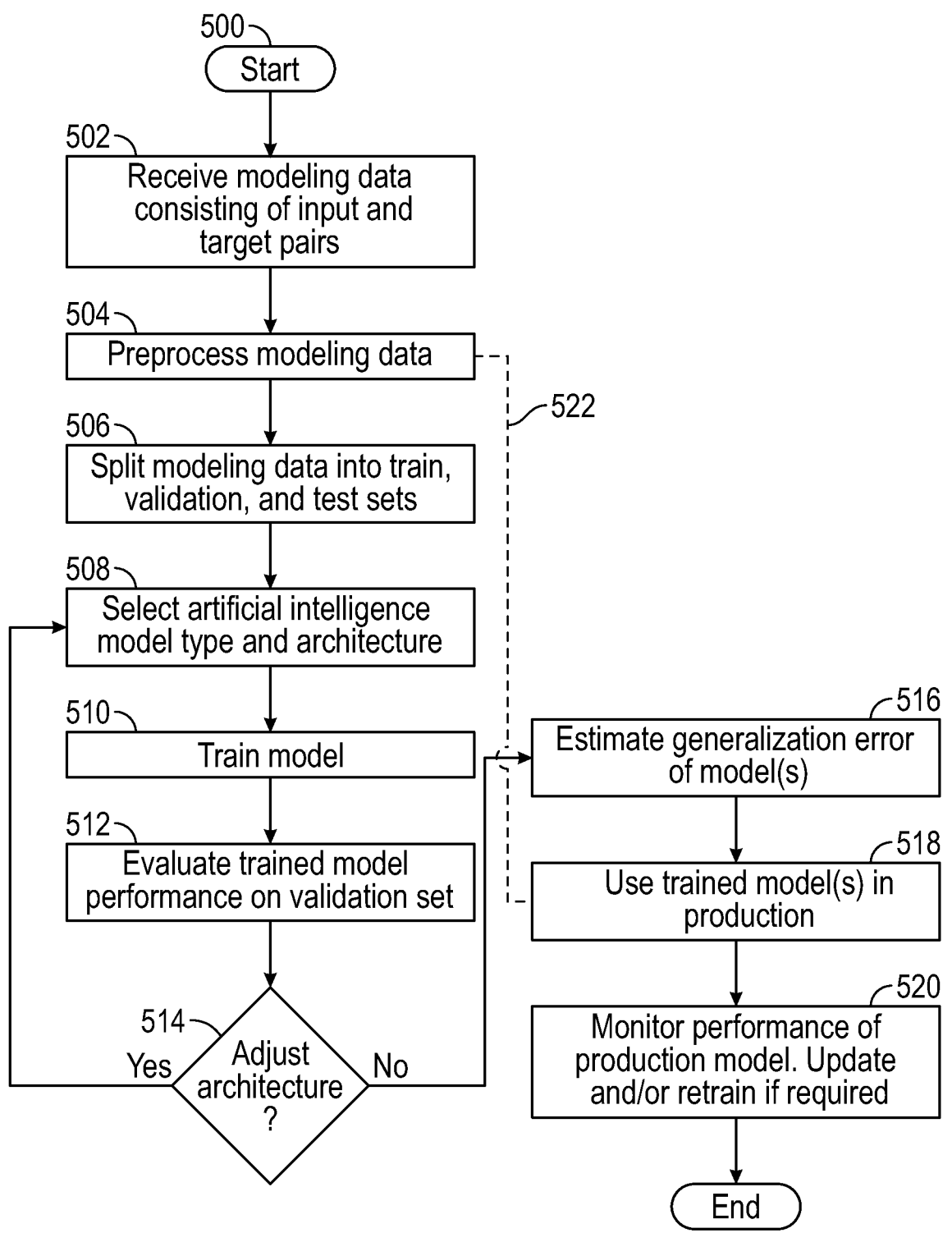
FIG. 5 depicts a flowchart, in accordance with one or more embodiments.

FIG. 5 depicts the general process of selecting and training the AI model, in accordance with one or more embodiments. The process shown in FIG. 5 may be applied to obtain the trained the AI model (410). To start, as shown in Block 502, modelling data is received. The modelling data consists of input and target pairs. For example, to train the AI model (410), an input and target pair may consist of a set of simulation parameters (302) and the associated simulated flow rates (322). Thus, the modelling data is composed of the plurality of sets of simulation parameters (402) and the plurality of sets of simulated flow rates (404), where the plurality of sets of simulated flow rates (404) are the result of processing the plurality of sets of simulation parameters (402) with the multiphase wellbore simulator (320). In accordance with one or more embodiments, the set of simulation parameters may include, but are not limited to, wellbore geometry parameters (304), fluid property parameters (306), well completion parameters (308), well operation parameters (310), reservoir properties (312), temperature data (314) and pressure data (316). In one or more embodiments, the temperature data (314) and pressure data (316) are collected using field devices appropriately disposed at one or more locations on the subsurface (102) section or obtained from previously collected historical well data. In other embodiments, the temperature data (314) and pressure data (316) are set to assigned values over a given range, or according to an intelligent selection process (described in greater detail later in the instant disclosure), in order to simulate a wide variety of flow conditions.

Returning to FIG. 5, in one or more embodiments, the modelling data is preprocessed as depicted by Block 504. Preprocessing, at a minimum, includes altering the modelling data so that it is suitable for use with AI models. For example, numericalizing categorical data or removing data entries with missing values. Other typical preprocessing methods are normalization and imputation. Information surrounding the preprocessing steps is saved for potential later use. For example, if normalization is performed then a computed mean vector and variance vector are retained. This allows future modelling data to be preprocessed identically. Values computed and retained during preprocessing are referred to herein as preprocessing parameters. One with ordinary skill in the art will recognize that a myriad of preprocessing methods beyond numericalization, removal of modelling data entries with missing values, normalization, and imputation exist. Descriptions of a select few preprocessing methods herein do not impose a limitation on the preprocessing steps encompassed by this disclosure.

As shown in Block 506, the modelling data is split into training, validation, and test sets. In some embodiments, the validation and test set may be the same such that the data is effectively only split into two distinct sets. In some instances, Block 506 may be performed before Block 504. In this case, it is common to determine the preprocessing parameters, if any, using the training set and then to apply these parameters to the validation and test sets.

In Block 508, the AI model type and associated architecture is selected. Once selected, the AI model is trained using the training set of the modelling data according to Block 510. Common training techniques, such as early stopping, adaptive or scheduled learning rates, and cross-validation may be used during training without departing from the scope of this disclosure.

During training, or once trained, the performance of the trained AI model is evaluated using the validation set as depicted in Block 512. Recall that, in some instances, the validation and test sets are the same. Generally, performance is measured using a function which compares the predictions of the trained AI model to the given targets. A commonly used comparison function is the mean-squared-error function, which quantifies the difference between the predicted value and the actual value when the predicted value is continuous. However, one with ordinary skill in the art will appreciate that many more comparison functions exist and may be used without limiting the scope of the present disclosure.

At Block 514, a determination is made as to whether the AI model architecture needs to be altered. If the trained AI model performance, as measured by a comparison function on the validation set (Block 512), is suitable, then the trained AI model is accepted for use in a production setting. As such, in Block 518, the trained AI model is used in production. However, before the AI model is used in production, a final indication of its performance can be acquired by estimating the generalization error of the trained AI model, as shown in Block 516. Generalization error is an indication of the trained AI model's performance on new, or un-seen data. Typically, the generalization error is estimated using the comparison function, as previously described, using the modelling data that was partitioned into the test set.

At Block 514, if the trained AI model performance is not suitable, the AI model architecture may be altered (i.e., return to Block 508) and the training process is repeated. There are many ways to alter the AI model architecture in search of suitable trained AI model performance. These include, but are not limited to: selecting a new architecture from a previously defined set; randomly perturbing or randomly selecting new hyperparameters; using a grid search over the available hyperparameters; and intelligently altering hyperparameters based on the observed performance of previous models (e.g., a Bayesian hyperparameter search). Once suitable performance is achieved, the training procedure is complete, and the generalization error of the trained AI model is estimated according to Block 516.

As depicted in Block 518, the trained AI model is used "in production"—which means, as previously stated, that the trained AI model is used to process a received input without having a paired target for comparison. It is emphasized that the inputs received in the production setting, as well as for the validation and test sets, are preprocessed identically to the manner defined in Block 504 as denoted by the connection (522), represented as a dashed line in FIG. 5, between Blocks 518 and 504.

In accordance with one or more embodiments, the performance of the trained AI model is continuously monitored in the production setting (520). If model performance is suspected to be degrading, as observed through in-production performance metrics, the model may be updated. An update may include retraining the model, by reverting to Block 508, with the newly acquired modelling data from the in-production recorded values appended to the training data. An update may also include recalculating any preprocessing parameters, again, after appending the newly acquired modelling data to the existing modelling data.

While the various blocks in FIG. 5 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

Figure 6:
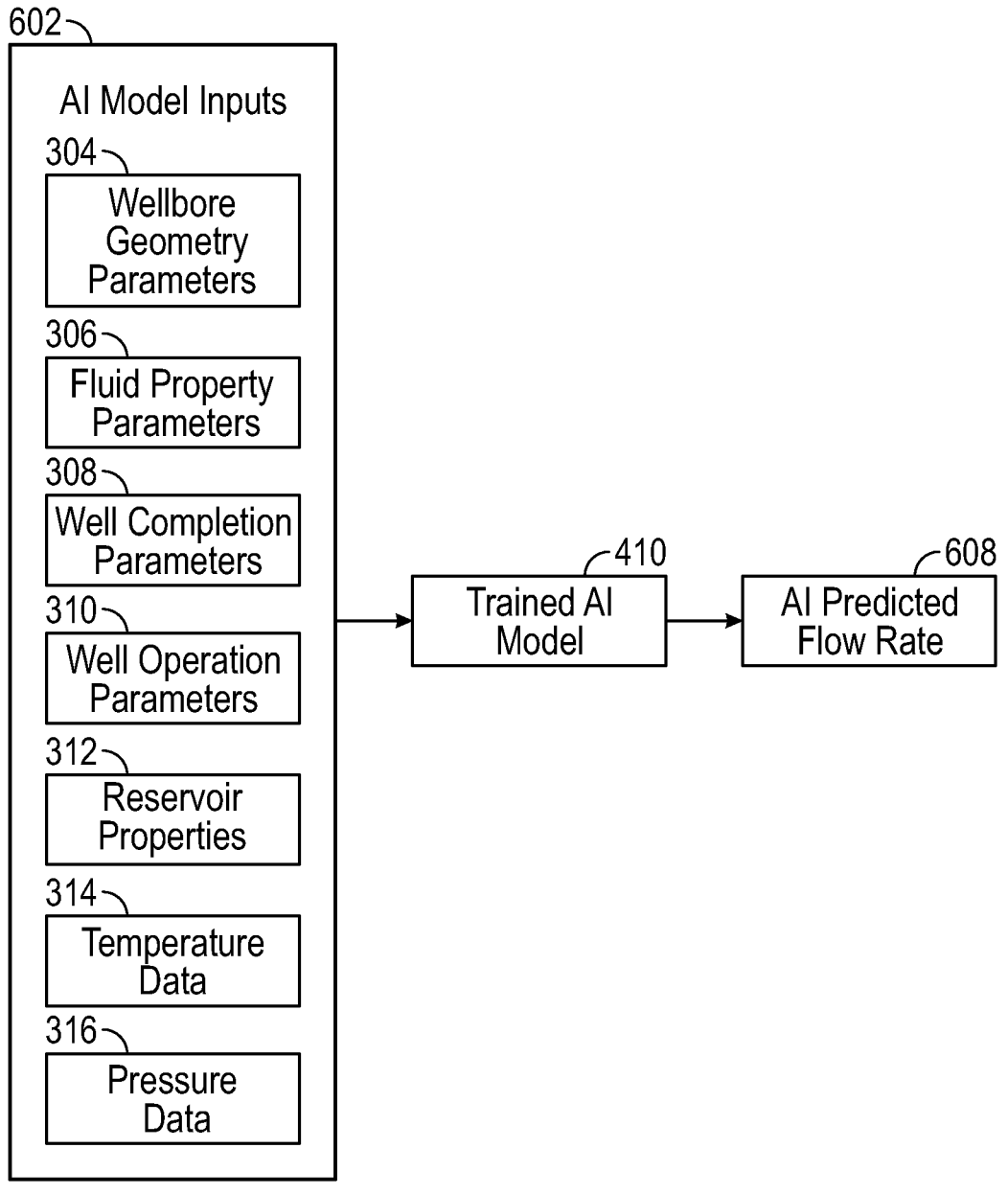
FIG. 6 depicts a system, in accordance with one or more embodiments.

The process of using the trained AI model (410) "in production" is summarized in the flowchart of FIG. 6. As previously stated, in this case, the trained AI model (410) is used to process a received input without having a paired target for comparison. To start, a set of AI model inputs (602) are received as inputs by the trained AI model (410). The AI model inputs (602) will be of the same form as the inputs used during training and thus may include wellbore geometry parameters (304), fluid property parameters (306), well completion parameters (308), well operation parameters (310), reservoir properties (312), temperature data (314) and pressure data (316) obtained at one or more locations on the subsurface (102) section. In accordance with one or more embodiments, the trained AI model (410) outputs an AI predicted flow rate (608).

In another example use of the present invention, the trained AI model (410) is used to process AI model inputs (602) acquired from a real, or non-simulated well. Thus, the AI model inputs (602) represent the configuration of the well (e.g., wellbore geometry parameters, well completion parameters, etc.), the reservoir accessed by the well (e.g., reservoir properties), and actual subsurface measurements of temperature and pressure (e.g., temperature data (314), pressure data (316)). The trained AI model (410) can process its input in real time, or near real time, such that AI predicted flow rates (608), or the predicted flow rate of each phase of the multiphase fluid produced by the well, can be determined in real time using only subsurface temperature and pressure data and knowledge of the well configuration. One with ordinary skill in the art will appreciate that many more examples exist, as will be described later in the instant disclosure, and may be used without limiting the scope of the present disclosure.

Embodiments of the present disclosure may provide at least one of the following advantages. As noted, complex interactions between oil and gas field components and sub-processes exist such that configuring a plurality of devices for optimal hydrocarbon production is a difficult task. Further, the state and behavior of oil and gas fields is transient over the lifetime of the constituent wells, often requiring continual changes to enhance hydrocarbon production. By continuously receiving and processing temperature data (314) and pressure data (316) with the trained AI model (410), the oil and gas field can be maintained in an optimal state, greatly reducing the cost and time required to identify optimal settings, which change with the transient nature of the wells. This, in turn, improves hydrocarbon (i.e., oil and gas) yields and prolongs the life of constituent wells. One with ordinary skill in the art will appreciate that many more examples exist, as will be described later in the instant disclosure, and may be used without limiting the scope of the present disclosure.

In another example use of the present invention, the trained AI model (410) is used to determine an optimal set of well operation parameters, where the set of well operation parameters consist of well "settings" (e.g., the state of a valve) that can be adjusted and ultimately affect the flow of the multiphase fluid in the pipeline. That is, the set of well operational parameters (302) define an operational state of an oil and gas field and thus affect the output of the oil and gas field, namely, hydrocarbon production. Upon identifying the set of well operational parameters (302) that optimize hydrocarbon production, these sets of parameters may be applied across the oil and gas field automatically using a control system (e.g., IFMS (125)). In one or more embodiments, hydrocarbon production, as monitored by at least one device from the plurality of oil and gas field devices, is continuously monitored to ensure that the accepted set of well operational parameters (302) maintain the oil and gas field at optimal hydrocarbon production.

Figure 7:
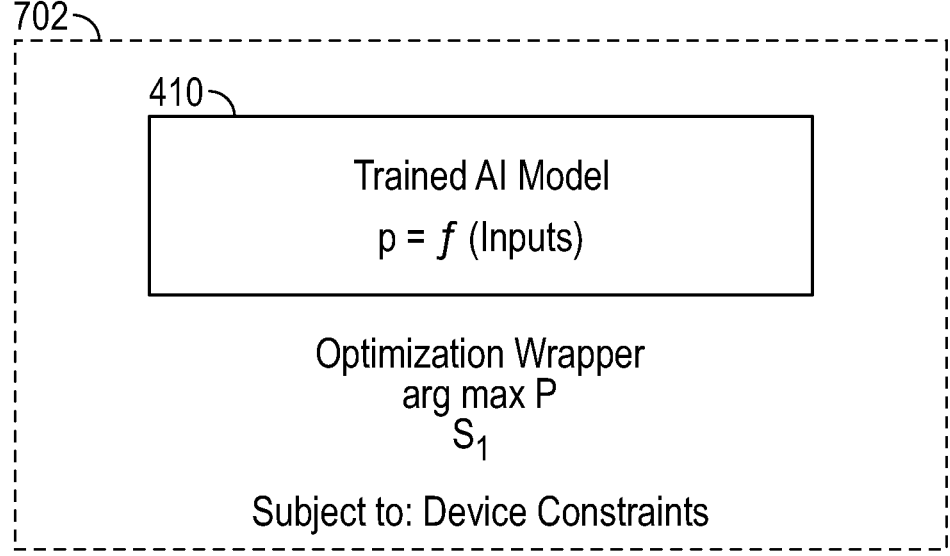
FIG. 7 depicts a system, in accordance with one or more embodiments.

The process of using the trained AI model (410) to determine the optimal set of well operation parameters (302) that optimize hydrocarbon production (P) is summarized in FIG. 7. In one or more embodiments, the AI model is trained using previously acquired modelling data, the modelling data generated using the multiphase wellbore simulator (320). As previously described, the modelling data is partitioned into "inputs" and "outputs". The outputs include a plurality of sets of simulated flow rates (404). The inputs include a plurality of sets of simulation parameters (402). The modelling data, partitioned into inputs and outputs, are used to train the AI model (408). The trained AI model (410) may be of any type known in the art. Generally, the AI model type and architecture with the greatest performance on a set of hold-out data is selected. Greater detail surrounding the training procedure for the AI model will be provided below in the context of a neural network. However, generally, training the AI model involves processing data to develop a functional relationship between elements of the data. The result of the training procedure is a trained AI model (410). The trained AI model may be described as a function relating the inputs and the outputs. That is, the AI model may be mathematically represented as outputs=$f$(inputs), such that, given an input, the trained AI model (410) may produce an output. In one or more embodiments, the trained AI model upon processing an input produces an output, namely, a predicted hydrocarbon production (P). With a trained AI model, an optimization wrapper (depicted as Block 702) is used to invert the model to determine the optimal set of well operation parameters that optimize hydrocarbon production (P). Mathematically, the optimization takes the form:

$$\underset{S_1}{\arg\max} P \qquad (1)$$

$$\text{subject to: device constraints,}$$

where the quantity P represents the predicted hydrocarbon production as determined using the trained AI model. Further, in EQ. 1, the set of well operation parameters is denoted as $S_1$. Thus, the optimization wrapper (702) maximizes the predicted hydrocarbon production (P) over the set of well operation parameters. The optimization wrapper (702), when applied to a trained AI model parameterized by the set of well operation parameters, returns a single and optimal set of well operation parameters. Optimization algorithms may include, but are not limited to: genetic, Newton conjugate gradient (Newton-CG), Broyden-Fletcher-Goldfarb-Shanno (BFGS) and limited-memory BFGS (L-BFGS) algorithms.

One with ordinary skill in the art will appreciate that maximization and minimization may be made equivalent through simple techniques such as negation. As such, the choice to represent the optimization as a maximization as shown in EQ. 1 does not limit the scope of the present disclosure. Whether done through minimization or maximization, the optimization wrapper (702) identifies the set (or sets) of well operation parameters that optimize hydrocarbon production (P) according to the trained AI model (410).

An oil and gas field may be subject to constraints, such as safety limits imposed on various devices and sub-processes of an oil and gas field. For example, it may be determined that in order for an oil and gas field to operate safely, pressure, as measured by a given field device, should not exceed a prescribed value. In FIG. 7, the constraints are referenced as device constraints. In one or more embodiments, the temperature data (314) and pressure data (316) are monitored by a control system (e.g., IFMS (125)) as well as device and process limits. In one or more embodiments, the optimization wrapper (702) cannot elect any set of well operation parameters that cause any portion of the oil and gas field to exceed predefined device constraints. Additional examples of constraints applied to the optimization may include predefined maximum allowable injection rates and production volume ratios.

In another example use of the present invention, the trained AI model (410) is directly used to test the effectiveness of a new drilling mud in an oil and gas field. Traditionally, this would require conducting expensive and time-consuming physical testing on the actual well. Specifically, the testing would involve shutting down production, installing testing equipment, and monitoring the production rates under controlled conditions. With the proposed approach, simulated training data can instead be generated using a physics-based multiphase wellbore simulator (320) that captures the thermodynamics and fluid dynamics of the multiphase flow rates. The simulated training is subsequently used to train an AI model to predict the flow rates of each phase based on temperature data (314) and pressure data (316). Once the AI model is trained, it can be used to predict the effect of the new drilling mud on the production rates without shutting down the well or installing any testing equipment.

Figure 8:
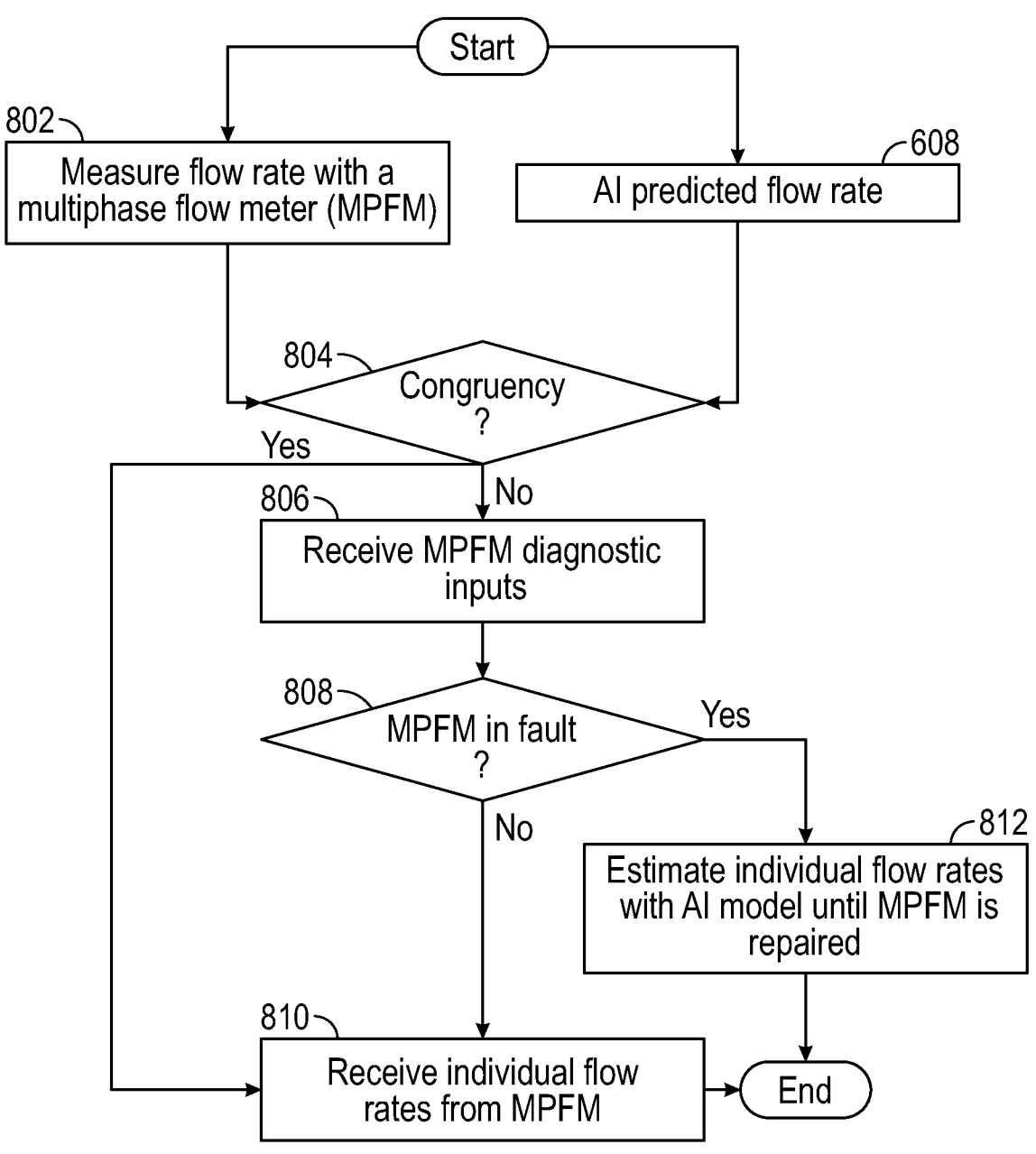
FIG. 8 depicts a flowchart, in accordance with one or more embodiments.

In another example given that the IFMS (125) can, at any given time, output MPFM measured phase flow rates (802) and AI predicted flow rates (608) to a user and/or an external system, FIG. 8 depicts a flowchart demonstrating which phase flow rate should be used.

As depicted in Block 804, if the measured flow rate (802) is congruent with the AI predicted flow rate (608) then the IFMS (125) outputs the received phase flow rates directly from the MPFM (810). As depicted in Block 804, if the measured flow rate (802) is incongruent with the AI predicted flow rate (608), the IFMS (125) receives diagnostic inputs from the MPFM (806). Congruency can be measured with a variety of metrics such as the mean absolute percentage error. For example, for a multiphase fluid consisting of K phases, where K≥1, the AI determined flow rate of the $k^{th}$ phase can be denoted as $p_k$ and the measured flow rate of the $k^{th}$ phase can be denoted as $m_k$. Then the mean absolute percentage error (MAPE) is given by $$MAPE = \frac{1}{K}\sum_{k=1}^{K}|p_k - m_k|. \qquad (2)$$

In one or more example use of the present invention, the measured flow rate(s) with a multiphase flow meter (802) and the AI predicted flow rates (608) are determined to be incongruent when the MAPE exceeds a predefined threshold, $\epsilon$. In one or more example use of the present invention, $\epsilon=0.1$ (or 10% average deviation between the measured and predicted values).

The MPFM diagnostic inputs (806) are processed in Block 808 and any issues (e.g., malfunctions) or potential issues (e.g., infrequent anomalous behavior) are identified. Further, in Block 808, if no issues (or potential issues) are detected, then the IFMS (125) outputs the received phase flow rates directly from the MPFM (810). If, however, in Block 808, any issues or potential issues are detected, the individual phase flow rates are estimated using the AI predicted flow rates (608) until the MPFM (127) is repaired, replaced, or otherwise made functional and accurate, as depicted in Block 812. One with ordinary skill in the art will appreciate that many more examples exist, as will be described later in the instant disclosure, and may be used without limiting the scope of the present disclosure.

FIG. 9 depicts a flowchart outlining usage of the trained AI model (401) "in production", in accordance with one or more embodiments. In Block 902, the trained AI model (401) obtains temperature data (314) and pressure data (316) of a multiphase fluid at one or more locations on the subsurface (102) section. A multiphase fluid is composed of one or more phases including, but not limited to, oil, water, and gas. The flow is controlled, at least in part, by a set of well operation parameters which may include, for example, injection rates and choke settings. In Block 904, a first phase flow rate measurement is determined with an AI model, given an input comprising the temperature data (314) and pressure data (316). In Block 906, an optimal set of well operation parameters based on, at least, the first predicted flow rate is determined with an optimizer applied to the AI model. Optimization algorithms may include, but are not limited to: genetic, Newton conjugate gradient (Newton-CG), Broyden-Fletcher-Goldfarb-Shanno (BFGS) and limited-memory BFGS (L-BFGS) algorithms. In Block 908, based on the determined phase flow rates, the IFMS (125) may adjust the settings of one or more field devices to optimize the production of the well. In general, the IFMS (125) can encompass many pipelines each with one or more temperature data (314) and pressure data (316) sensors. The flow rate data determined and output by the IFMS (125) may be received by a system user or an external system. For example, the flow rate data may be used by a reservoir simulator or subsurface model to optimize production of hydrocarbons from a well and/or oil and gas field. As such, the IFMS (125) provides accurate multiphase flow rate measurements from a well, or oil and gas field, without interruption, even when one or more MPFMs (127) are malfunctioning. Further, the IFMS (125) allows for proactive and intelligent scheduling of MPFM (127) maintenance activities.

Embodiments of the instant disclosure can provide one or more of the following advantages. As noted, if a MPFM is faulty or otherwise unavailable, the AI model can predict the flow rates using temperature and pressure data. Further, the AI model can provide real-time, or near real-time, predictions of flow rates using subsurface temperature and pressure data, which can be useful for immediate decision-making and operational adjustments. The AI model can also be used to determine optimal well operation parameters to maximize hydrocarbon production. This is done by processing inputs and predicting outputs (e.g., hydrocarbon production rates) that can be used to adjust operational parameters for optimal performance. Moreover, the AI model can virtually test the impact of proposed changes before implementing various well operating conditions, allowing for a more informed decision-making process without the need to physically alter the well setup. The AI model can also continuously receive and process temperature and pressure data to maintain the oil and gas field in an optimal state, which can change due to the transient nature of the wells. Further, the AI model can simulate the impact of new materials, such as drilling mud, on production rates without the need for physical testing. As such, the AI model is a versatile tool that complements physical measurements and provides additional insights and predictive capabilities to the operation of oil and gas fields.

Figure 10:
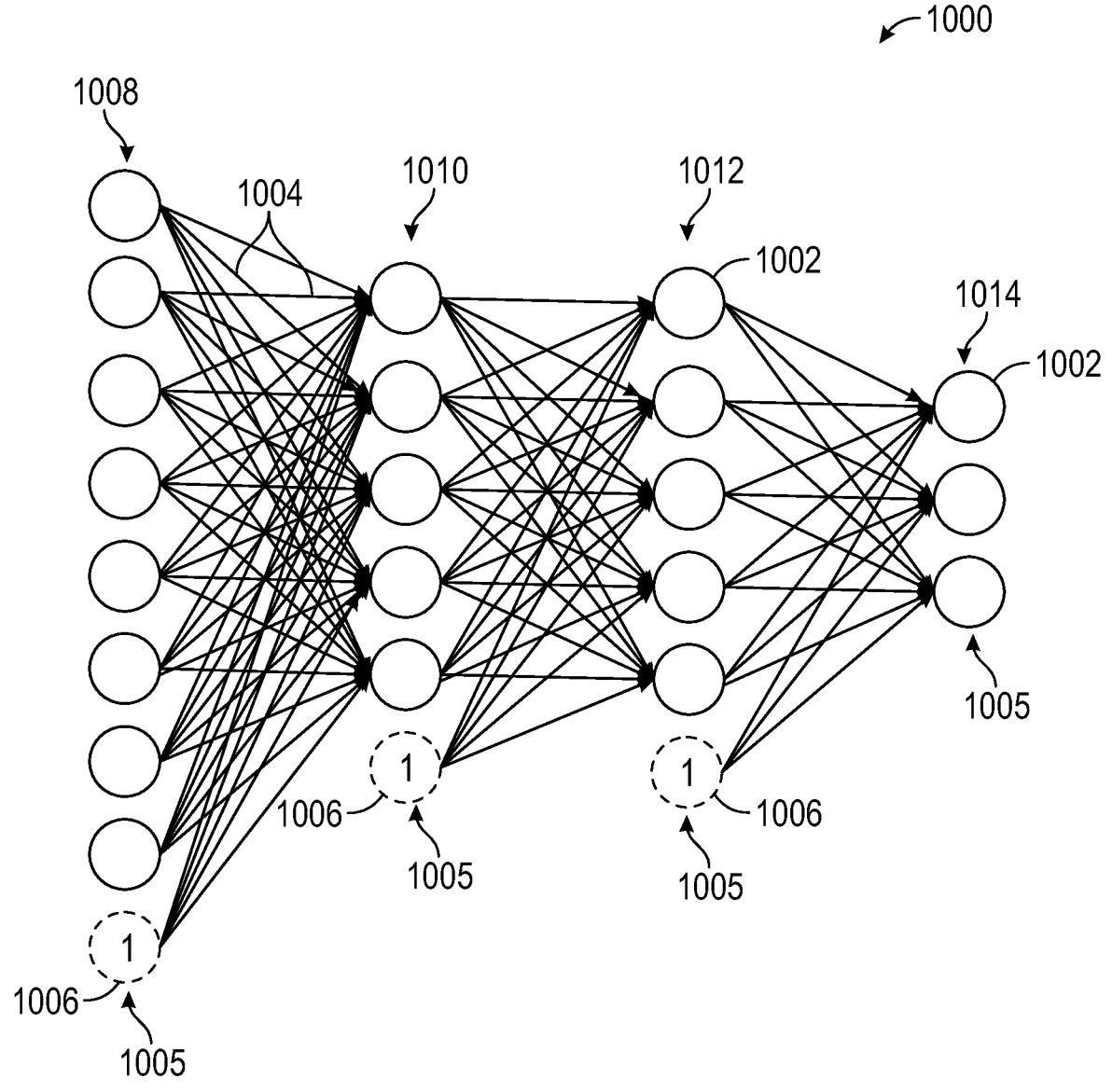
FIG. 10 depicts a neural network, in accordance with one or more embodiments.

In accordance with one or more embodiments, the trained AI model (410) discussed herein may be a neural network. A diagram of a neural network is shown in FIG. 10. At a high level, a neural network (1000) may be graphically depicted as being composed of nodes (1002), where here any circle represents a node, and edges (1004), shown here as directed lines. The nodes (1002) may be grouped to form layers (1005). FIG. 10 displays four layers (1008, 1010, 1012, 1014) of nodes (1002) where the nodes (1002) are grouped into columns, however, the grouping need not be as shown in FIG. 10. The edges (1004) connect the nodes (1002). Edges (1004) may connect, or not connect, to any node(s) (1002) regardless of which layer (1005) the node(s) (1002) is in. That is, the nodes (1002) may be sparsely and residually connected. A neural network (1000) will have at least two layers (1005), where the first layer (1008) is considered the "input layer" and the last layer (1014) is the "output layer." Any intermediate layer (1010, 1012) is usually described as a "hidden layer". A neural network (1000) may have zero or more hidden layers (1010, 1012) and a neural network (1000) with at least one hidden layer (1010, 1012) may be described as a "deep" neural network or as a "deep learning method." In general, a neural network (1000) may have more than one node (1002) in the output layer (1014). In this case the neural network (1000) may be referred to as a "multi-target" or "multi-output" network.

Nodes (1002) and edges (1004) carry additional associations. Namely, every edge is associated with a numerical value. The edge numerical values, or even the edges (1004) themselves, are often referred to as "weights" or "parameters." While training a neural network (1000), numerical values are assigned to each edge (1004). Additionally, every node (1002) is associated with a numerical variable and an activation function. Activation functions are not limited to any functional class, but traditionally follow the form $$A = f\left(\sum_{i\in(incoming)}[(node\ value)_i(edge\ value)_i]\right), \qquad (3)$$

where i is an index that spans the set of "incoming" nodes (1002) and edges (1004) and $f$ is a user-defined function. Incoming nodes (1002) are those that, when viewed as a graph (as in FIG. 10), have directed arrows that point to the node (1002) where the numerical value is being computed. Some functions for $f$ may include the linear function $f(x)=x$, sigmoid function $$f(x) = \frac{1}{1 + e^{-x}},$$

and rectified linear unit function $f(x)=\max(0, x)$, however, many additional functions are commonly employed. Every node (1002) in a neural network (1000) may have a different associated activation function. Often, as a shorthand, activation functions are described by the function $f$ by which it is composed. That is, an activation function composed of a linear function $f$ may simply be referred to as a linear activation function without undue ambiguity.

When the neural network (1000) receives an input, the input is propagated through the network according to the activation functions and incoming node (1002) values and edge (1004) values to compute a value for each node (1002). That is, the numerical value for each node (1002) may change for each received input. Occasionally, nodes (1002) are assigned fixed numerical values, such as the value of 1, that are not affected by the input or altered according to edge (1004) values and activation functions. Fixed nodes (1002) are often referred to as "biases" or "bias nodes" (1006), displayed in FIG. 10 with a dashed circle.

In some implementations, the neural network (1000) may contain specialized layers (1005), such as a normalization layer, or additional connection procedures, like concatenation. One skilled in the art will appreciate that these alterations do not exceed the scope of this disclosure.

As noted, the training procedure for the neural network (1000) comprises assigning values to the edges (1004). To begin training the edges (1004) are assigned initial values. These values may be assigned randomly, assigned according to a prescribed distribution, assigned manually, or by some other assignment mechanism. Once edge (1004) values have been initialized, the neural network (1000) may act as a function, such that it may receive inputs and produce an output. As such, at least one input is propagated through the neural network (1000) to produce an output. Recall, that a given data set will be composed of inputs and associated target(s), where the target(s) represent the "ground truth," or the otherwise desired output. In accordance with one or more embodiments, the input of the neural network may be a set of simulation parameters (302) and the targets may be the associated simulated flow rates (322), where the simulated flow rates (322) are the result of processing the simulation parameters (302) with the multiphase wellbore simulator (320).

The neural network (1000) output is compared to the associated input data target(s). The comparison of the neural network (1000) output to the target(s) is typically performed by a so-called "loss function;" although other names for this comparison function such as "error function," "misfit function," and "cost function" are commonly employed. Many types of loss functions are available, such as the mean-squared-error function, however, the general characteristic of a loss function is that the loss function provides a numerical evaluation of the similarity between the neural network (1000) output and the associated target(s). The loss function may also be constructed to impose additional constraints on the values assumed by the edges (1004), for example, by adding a penalty term, which may be physics-based, or a regularization term. Generally, the goal of a training procedure is to alter the edge (1004) values to promote similarity between the neural network (1000) output and associated target(s) over the data set. Thus, the loss function is used to guide changes made to the edge (1004) values, typically through a process called "backpropagation."

While a full review of the backpropagation process exceeds the scope of this disclosure, a brief summary is provided. Backpropagation consists of computing the gradient of the loss function over the edge (1004) values. The gradient indicates the direction of change in the edge (1004) values that results in the greatest change to the loss function. Because the gradient is local to the current edge (1004) values, the edge (1004) values are typically updated by a "step" in the direction indicated by the gradient. The step size is often referred to as the "learning rate" and need not remain fixed during the training process. Additionally, the step size and direction may be informed by previously seen edge (1004) values or previously computed gradients. Such methods for determining the step direction are usually referred to as "momentum" based methods.

Once the edge (1004) values have been updated, or altered from their initial values, through a backpropagation step, the neural network (1000) will likely produce different outputs. Thus, the procedure of propagating at least one input through the neural network (1000), comparing the neural network (1000) output with the associated target(s) with a loss function, computing the gradient of the loss function with respect to the edge (1004) values, and updating the edge (1004) values with a step guided by the gradient, is repeated until a termination criterion is reached. Common termination criteria are: reaching a fixed number of edge (1004) updates, otherwise known as an iteration counter; a diminishing learning rate; noting no appreciable change in the loss function between iterations; reaching a specified performance metric as evaluated on the data or a separate hold-out data set. Once the termination criterion is satisfied, and the edge (1004) values are no longer intended to be altered, the neural network (1000) is said to be "trained".

While multiple embodiments using different AI models have been suggested, one skilled in the art will appreciate that this process, of determining the set of well operation parameters that optimize hydrocarbon production is not limited to the listed AI models. AI models such as a random forest, support vector machines, or non-parametric methods such as K-nearest neighbors may be readily inserted into this framework and do not depart from the scope of this disclosure.

Figure 11:
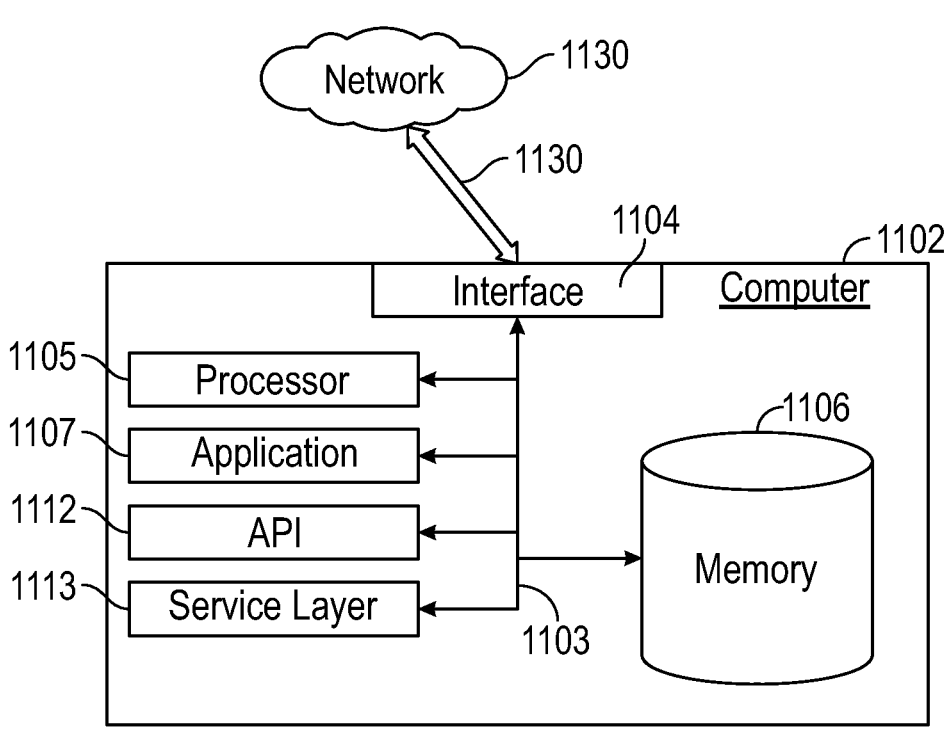
FIG. 11 depicts a computing system, in accordance with one or more embodiments.

Embodiments may be implemented on a computer system. FIG. 11 is a block diagram of a computer system (1102) used to provide computational functionalities associated with described algorithms, methods, functions, processes, flows, and procedures as described in the instant disclosure, according to one or more embodiments. The illustrated computer (1102) is intended to encompass any computing device such as a server, desktop computer, laptop/notebook computer, wireless data port, smart phone, personal data assistant (PDA), tablet computing device, one or more processors within these devices, or any other suitable processing device such as an edge computing device, including both physical or virtual instances (or both) of the computing device. An edge computing device is a dedicated computing device that is, typically, physically adjacent to the process or control with which it interacts. For example, the AI model may be implemented on an edge computing device in order to quickly provide optimal sets of well operation parameters to associated field devices or their controllers (e.g., a control system).

Additionally, the computer (1102) may include a computer that includes an input device, such as a keypad, keyboard, touch screen, or other device that can accept user information, and an output device that conveys information associated with the operation of the computer (1102), including digital data, visual, or audio information (or a combination of information), or a GUI.

The computer (1102) can serve in a role as a client, network component, a server, a database or other persistency, or any other component (or a combination of roles) of a computer system for performing the subject matter described in the instant disclosure. In some implementations, one or more components of the computer (1102) may be configured to operate within environments, including cloud-computing-based, local, global, or other environment (or a combination of environments).

At a high level, the computer (1102) is an electronic computing device operable to receive, transmit, process, store, or manage data and information associated with the described subject matter. According to some implementations, the computer (1102) may also include or be communicably coupled with an application server, e-mail server, web server, caching server, streaming data server, business intelligence (BI) server, or other server (or a combination of servers).

The computer (1102) can receive requests over network (1130) from a client application (for example, executing on another computer (1102) and responding to the received requests by processing the said requests in an appropriate software application. In addition, requests may also be sent to the computer (1102) from internal users (for example, from a command console or by other appropriate access method), external or third-parties, other automated applications, as well as any other appropriate entities, individuals, systems, or computers.

Each of the components of the computer (1102) can communicate using a system bus (1103). In some implementations, any or all of the components of the computer (1102), both hardware or software (or a combination of hardware and software), may interface with each other or the interface (1104) (or a combination of both) over the system bus (1103) using an application programming interface (API) (1112) or a service layer (1113) (or a combination of the API (1112) and service layer (1113). The API (1112) may include specifications for routines, data structures, and object classes. The API (1112) may be either computer-language independent or dependent and refer to a complete interface, a single function, or even a set of APIs. The service layer (1113) provides software services to the computer (1102) or other components (whether or not illustrated) that are communicably coupled to the computer (1102). The functionality of the computer (1102) may be accessible for all service consumers using this service layer. Software services, such as those provided by the service layer (1113), provide reusable, defined business functionalities through a defined interface. For example, the interface may be software written in JAVA, C++, or other suitable language providing data in extensible markup language (XML) format or another suitable format. While illustrated as an integrated component of the computer (1102), alternative implementations may illustrate the API (1112) or the service layer (1113) as stand-alone components in relation to other components of the computer (1102) or other components (whether or not illustrated) that are communicably coupled to the computer (1102). Moreover, any or all parts of the API (1112) or the service layer (1113) may be implemented as child or sub-modules of another software module, enterprise application, or hardware module without departing from the scope of this disclosure.

The computer (1102) includes an interface (1104). Although illustrated as a single interface (1104) in FIG. 11, two or more interfaces (1104) may be used according to particular needs, desires, or particular implementations of the computer (1102). The interface (1104) is used by the computer (1102) for communicating with other systems in a distributed environment that are connected to the network (1130). Generally, the interface (1104) includes logic encoded in software or hardware (or a combination of software and hardware) and operable to communicate with the network (1130). More specifically, the interface (1104) may include software supporting one or more communication protocols associated with communications such that the network (1130) or interface's hardware is operable to communicate physical signals within and outside of the illustrated computer (1102).

The computer (1102) includes at least one computer processor (1105). Although illustrated as a single computer processor (1105) in FIG. 11, two or more processors may be used according to particular needs, desires, or particular implementations of the computer (1102). Generally, the computer processor (1105) executes instructions and manipulates data to perform the operations of the computer (1102) and any algorithms, methods, functions, processes, flows, and procedures as described in the instant disclosure.

The computer (1102) also includes a memory (1106) that holds data for the computer (1102) or other components (or a combination of both) that can be connected to the network (1130). The memory may be a non-transitory computer readable medium. For example, memory (1106) can be a database storing data consistent with this disclosure. Although illustrated as a single memory (1106) in FIG. 11, two or more memories may be used according to particular needs, desires, or particular implementations of the computer (1102) and the described functionality. While memory (1106) is illustrated as an integral component of the computer (1102), in alternative implementations, memory (1106) can be external to the computer (1102).

The application (1107) is an algorithmic software engine providing functionality according to particular needs, desires, or particular implementations of the computer (1102), particularly with respect to functionality described in this disclosure. For example, application (1107) can serve as one or more components, modules, applications, etc. Further, although illustrated as a single application (1107), the application (1107) may be implemented as multiple applications (1107) on the computer (1102). In addition, although illustrated as integral to the computer (1102), in alternative implementations, the application (1107) can be external to the computer (1102).

There may be any number of computers (1102) associated with, or external to, a computer system containing computer (1102), wherein each computer (1102) communicates over network (1130). Further, the term "client," "user," and other appropriate terminology may be used interchangeably as appropriate without departing from the scope of this disclosure. Moreover, this disclosure contemplates that many users may use one computer (1102), or that one user may use multiple computers (1102).

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A method, comprising:

obtaining temperature and pressure data of flow of a multiphase fluid comprising a first phase at a first and a second location in a wellbore conveying the flow, wherein the flow is controlled, at least in part, by a set of well operation parameters;

determining, with an artificial intelligence (AI) model, a first predicted flow rate of the first phase at a third location given an input comprising the temperature and pressure data;

measuring a first flow rate of the first phase at the third location with a multiphase flow meter (MPFM);

setting the measured first flow rate as a trusted first flow rate, where the trusted first flow rate represents an actual first flow rate of the first phase;

making a first determination of whether the measured first flow rate is incongruent with the first predicted flow rate;

making a second determination of whether the MPFM is in fault using MPFM diagnostic inputs;

setting the first predicted flow rate as the trusted first flow rate in response to a determination that the measured first flow rate is incongruent with the first predicted flow rate and that the MPFM is in fault based on the first determination and the second determination, determining, with an optimizer applied to the AI model, an optimal set of well operation parameters based on, at least, the trusted first flow rate; and adjusting, automatically, the set of well operation parameters to the optimal set of well operation parameters, wherein the set of well operation parameters comprises a choke setting for a choke valve of the wellbore such that the optimizer applied to the AI model determines an optimal choke setting, wherein the method further comprises automatically commanding the choke valve based on the optimal choke setting in order to optimize the flow of the multiphase fluid, and wherein the optimizer applied to the AI model is a limited-memory Broyden-Fletcher-Goldfarb-Shanno (L-BFGS) algorithm.

2. The method of claim 1, wherein the multiphase fluid further comprises a second phase, the method further comprising:

determining, with the AI model, a second predicted flow rate of the second phase, and determining the optimal set of operation parameters is further based on the second predicted flow rate.

3. The method of claim 1, further comprising:

measuring an oil and gas production from the wellbore; and validating the optimal set of well operation parameters with a determination that the oil and gas production is improved in response to adjusting the set of well operation parameters to the optimal set of well operation parameters.

4. The method of claim 1, wherein the AI model is a neural network.

5. The method of claim 1, wherein determining with the AI model the first predicted flow rate, the input further comprises reservoir properties of a reservoir accessed with the wellbore.

6. A system, comprising:

a well with a wellbore conveying a flow of a multiphase fluid, the flow being controlled, at least in part, by a set of well operation parameters;

a first pressure sensor and a first temperature sensor disposed in the wellbore at a first and a second location and configured to measure a first pressure data and a first temperature data;

a multiphase flow meter (MPFM) configured to measure a first flow rate of a first phase of the multiphase fluid at a third location; and a computer comprising one or more computer processors configured to:

obtain the first temperature data and the first pressure data of the flow of the multiphase fluid from the first pressure sensor and the first temperature sensor;

determine, with an artificial intelligence (AI) model, a first predicted flow rate of the first phase of the multiphase fluid at the third location given an input comprising the first temperature data and the first pressure data;

set the measured first flow rate as a trusted first flow rate, where the trusted first flow rate represents an actual first flow rate of the first phase;

make a first determination of whether the measured first flow rate is incongruent with the first predicted flow rate;

make a second determination of whether the MPFM is in fault;

set the first predicted flow rate as the trusted first flow rate in response to a determination that the measured first flow rate is incongruent with the first predicted flow rate and that the MPFM is in fault based on the first determination and the second determination;

determine, with an optimizer applied to the AI model, an optimal set of well operation parameters based on, at least, the trusted first flow rate; and adjust, automatically, the set of well operation parameters to the optimal set of well operation parameters, wherein the set of well operation parameters comprises a choke setting for a choke valve of the wellbore such that the optimizer applied to the AI model determines an optimal choke setting, wherein the one or more computer processors are further configured to automatically command the choke valve based on the optimal choke setting in order to optimize the flow of the multiphase fluid, and wherein the optimizer applied to the AI model is a limited-memory Broyden-Fletcher-Goldfarb-Shanno (L-BFGS) algorithm.

7. The system of claim 6, wherein the computer comprising one or more computer processors further comprises:

a multiphase wellbore simulator, the multiphase wellbore simulator based on a set of physical equations that simulates the flow of the multiphase fluid given a set of simulation parameters, the set of simulation parameters comprising:

a set of wellbore geometry parameters that define a geometry of the wellbore, a set of fluid property parameters, a set of well completion parameters, a set of well operation parameters, a set of reservoir properties, a second temperature data obtained using a second temperature sensor disposed at a fourth location in the wellbore, and a second pressure data obtained using a second pressure sensor disposed at a fifth location in the wellbore;

wherein the multiphase wellbore simulator simulates a first flow rate of the first phase at the third location given the set of simulation parameters, wherein the AI model is trained using, at least, the set of simulation parameters and the corresponding simulated first flow rate.

8. The system of claim 6, wherein the AI model is a neural network.

* * * * *